United States Patent
Lee et al.

(10) Patent No.: US 6,998,759 B2
(45) Date of Patent: Feb. 14, 2006

(54) PIEZOELECTRIC LAMINATE MOTION SENSING APPARATUS AND METHOD

(75) Inventors: Chih-Kung Lee, 4F, No. 9, Lane 155 Tun Hwa North Road, Taipei (TW); Yu-Hsiang Hsu, Taipei (TW); Long-Sun Huang, Taipei (TW); Der-Chang Hsieh, Taipei (TW)

(73) Assignee: Chih-Kung Lee, Taipei (TW)

(*) Notice: Subject to any disclaimer, the term of this patent is extended or adjusted under 35 U.S.C. 154(b) by 0 days.

(21) Appl. No.: 09/908,047

(22) Filed: Jul. 18, 2001

(65) Prior Publication Data

US 2003/0001462 A1    Jan. 2, 2003

(30) Foreign Application Priority Data

Jul. 28, 2000  (TW)  ............................... 89115121 A

(51) Int. Cl.
 *H01L 41/08*   (2006.01)
(52) U.S. Cl. .................. 310/311; 310/321; 310/365
(58) Field of Classification Search .......... 310/316.01, 310/317, 319, 326, 328–332, 365, 366, 334, 310/339, 311, 321, 322, 3, 800
See application file for complete search history.

(56) References Cited

U.S. PATENT DOCUMENTS

| | | | | |
|---|---|---|---|---|
| 4,048,526 A | * | 9/1977 | Taylor | 310/329 |
| 4,158,787 A | * | 6/1979 | Forward | 310/51 |
| 4,565,940 A | * | 1/1986 | Hubbard, Jr. | 310/326 |
| 4,849,668 A | * | 7/1989 | Crawley et al. | 310/328 |
| 4,868,447 A | * | 9/1989 | Lee et al. | 310/328 |
| 5,088,326 A | * | 2/1992 | Wada et al. | 73/514.34 |
| 6,011,345 A | * | 1/2000 | Murray et al. | 310/321 |
| 6,049,157 A | * | 4/2000 | Kobayashi | 310/316.01 |
| 6,252,334 B1 | * | 6/2001 | Nye et al. | 310/328 |

* cited by examiner

*Primary Examiner*—Mark Budd
(74) *Attorney, Agent, or Firm*—J.C. Patents

(57) ABSTRACT

A motion sensing system utilizing piezoelectric laminates with predetermined surface electrode patterns disposed thereon utilizes a frequency selector to pass motion waves of predetermined frequencies and an electrical circuit for processing the electrical signals for transmission to an activating device for appropriate activation. In particular, the frequency selector is a low frequency bandpass filter for free-fall acceleration wave frequencies. By directing appropriate action, the present invention increases the applicability of the device upon which it is mounted (e.g., for military or other hostile environment use), decreases the possibility of damage, and lengthens its useful life.

6 Claims, 17 Drawing Sheets

PIEZOELECTRIC LAMINATE MOTION SENSING APPARATUS AND METHOD

FIELD OF THE INVENTION

This invention relates generally to motion sensing devices and more particularly to a conformable piezoelectric laminate sensing structure utilizing a distribute electrode pattern for sensing free-fall motion waves.

BACKGROUND OF THE INVENTION

A point sensor/actuator (accelerometer or transducer) utilizing the piezoelectric effect reacts to or induces force, displacement, or acceleration at a point in a structure embodying the sensor/actuator. No a priori knowledge about the structure is needed to achieve the desired sensing or actuating. Discrete point sensors/actuators to detect and control the vibrations of flexible structures such as robot arms, satellite antennas and the like have been in existence for over thirty years. However, actuator/observer spillover due to residual (uncontrolled) vibration modes in conventional systems lead to instabilities in closed-loop control systems. The independent modal-space control method utilizing pre-filtering and modal filtering has been proposed to solve the spillover problem. In one prior art instance, a modal-filtering process generated signals from an array of discrete point sensors simultaneously and then fed the signals into a control loop circuit, but the large number of signals and subsequent amount of signal processing required resulted in significant phase delays in the control loop circuit, thereby rendering the system unreliable at best and inoperable at worst.

Conventional point-sensors operate at specific given points on a structure to collect motion signals, or they may operate as different structures themselves or in operate in different states to detect different specific motion/vibration signals. In cases where the measurement of motions or vibrations itself is not influenced by the device to be measured, the motion sensing and measurement is relatively simple. However, in practice, conventional point sensors are clearly affected by the characteristics of their own structure when making a motion detection and thus they are limited by an effective use bandwidth (i.e., within which there is no self-effect).

Distributed surface electrode patterns and their directions of polarization can increase the effective use bandwidth of the sensors. Because electrodes can be distributed in space, in addition to being able to detect the total motion of a body, the distributed force on that body (the force on particular parts of the body) can also be measured. However, because distributed sensing requires a sensor pattern specific to the structure in question, the sensing system must be re-designed for each different application. Thus distributed sensing systems suffered from lack of general applicability. This is the principal reason to date why distributed sensor systems have not been as widely used as point sensor systems.

The piezoelectric effect is the phenomenon whereby certain materials, when subjected to a distorting force will produce an electrical polarization and a subsequent electromotive force Conversely, when an electromotive force is applied to such a material, it will change its shape in response to that emf. Thus, piezoelectric materials can be used as motion sensors or actuators. However, conventional piezoelectric materials are typically crystalline or polycrystalline and therefore brittle and not easily conformable.

SUMMARY OF THE INVENTION

It is an objective of the present invention to provide a miniature distributed sensing system that is applicable for many different structures, without the need for significant redesign. The invention comprises an effectively one-dimensional motion sensing system utilizing piezoelectric laminates with predetermined surface electrode patterns disposed thereon. A frequency selector passes motion waves of predetermined frequencies and an electrical circuit processes the electrical signals and transmits them to an activating device for activation in response to the electrical signals. In particular, the frequency selector is a low frequency bandpass filter for free-fall acceleration wave frequencies. By directing appropriate action, the present invention increases the applicability of the device upon which it is mounted (e.g., for military or other hostile environment use), decreases the possibility of damage, and lengthens its useful life.

DETAILED DESCRIPTION OF THE INVENTION

The preferred embodiment of the present invention is a motion sensor/actuator utilizing conformable piezoelectric laminate sensor structures having discrete and distributed surface electrode arrays. In one preferred embodiment, extremely low frequency motions or vibrations are sensed and the boundary conditions of the structure itself and other special characteristics of the structure, such as its self-damping function act to avoid phase delays in the control system and provide compensation for the entire system. The present invention utilizes a normal mode expansion distributed modal sensors design which, together with appropriate boundary conditions, produce a characteristic polynomial wave transmission spatial bandpass filter. The frequency response functions of the distributed sensors provide an adjustment capability for increasing the bandwidth of the measurement and/or increasing the frequency selection, thereby providing a system suitable for detection and actuation of different type motions. Thus the present invention provides a single design that is sufficient for many different applications. Actuation is achieved by applying an electric field to the structure and sensing is achieved by measuring the electric signal generated from a physical change in the structure. In a sensing operation, the charge generated by deformations in a piezoelectric material are collected by the array of surface electrodes, spatial modal filtering is performed, and for large, complex structures having many surface electrodes, parallel processing of signals avoids control loop phase delays. In utilizing a wave mode formulation and a dispersion relation in the design of the present invention, the distributed sensors have transfer functions with amplitude response tailored to low-pass or high-pass filtering without suffering any phase-delay, i.e., achieving non-causal compensation for control of the structure.

The preferred embodiment of the present invention advantageously utilizes laminated sensing structures composed of polyvinylidene fluoride ($PVF_2$). However, it is understood by those in the art that any material that exhibits the piezoelectric effect is within the scope of the present invention; for example, any material with ferro electric behavior such as poly(vinylidene fluroide-trifluorethylene) or $VF_2VF_3$, lead zirconate titanate or PZT, and the like.

Polyvinylidene fluoride polymer (PVDF or $PVF_2$) exhibits a strong piezoelectric effect and is a flexible, conformable material having relatively low acoustic impedance and low Q value. It is rugged, light weight, inexpensive and easily produced and cut, and is therefore suitable for many applications such as the distributed sensors and actuators of the present invention.

Figure 1:
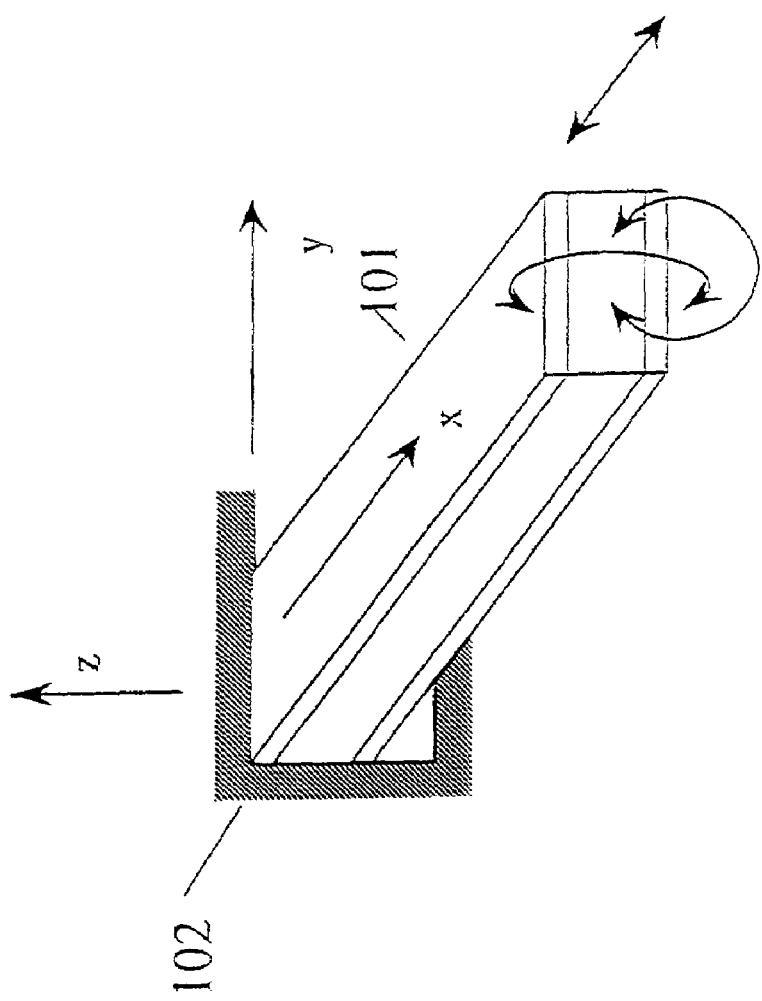
FIG. 1 is a schematic representation of a beam fixed to structure at one end.

The piezoelectric laminate of the present invention comprises thin layers of material, some with piezoelectric properties and some without piezoelectric properties. FIG. 1 is a schematic representation of a beam 101 fixed to structure 102 at one end. Beam 101 undergoes three possible motions: bending in the y-axis and z-axis directions, twisting around the x-axis, and stretching (extension or tension) in the x-axis direction. Plates and beams are the fundamental elements of larger, more complicated structures, so the detection and control of the motions of complex structures can be addressed in relation to the motions of a beam element. The beam is extensible, compressible, twistable, and conformable and the composite of beam element motions constitutes the motion of the larger structure of which the beams are constituents.

Figure 2:
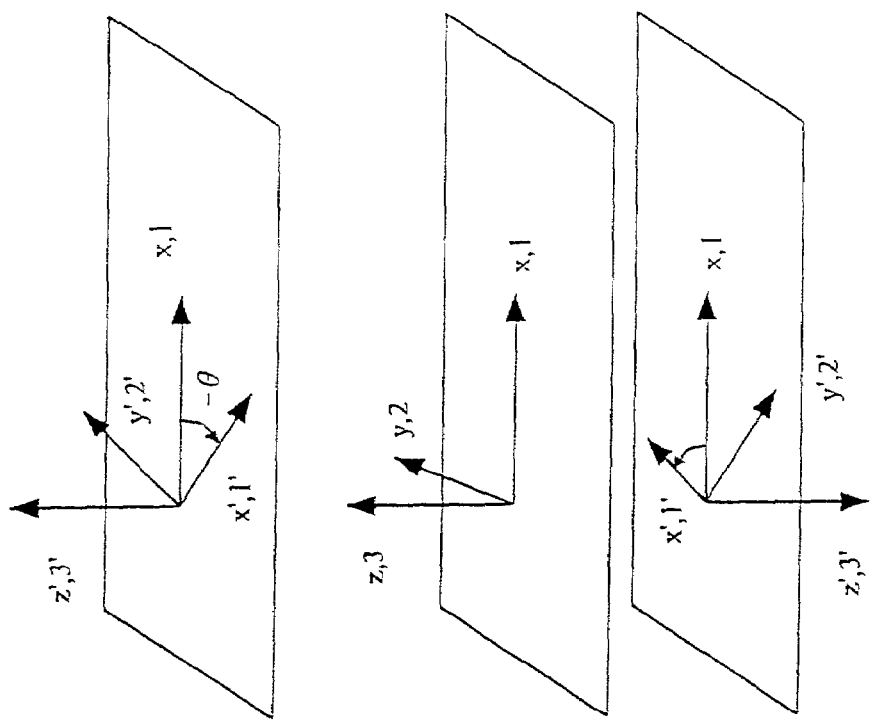
FIG. 2 is a schematic diagram showing the skew angle $\pm\theta$ between the structural principal axes and the material axes of a set of lamina.
Figure 3:
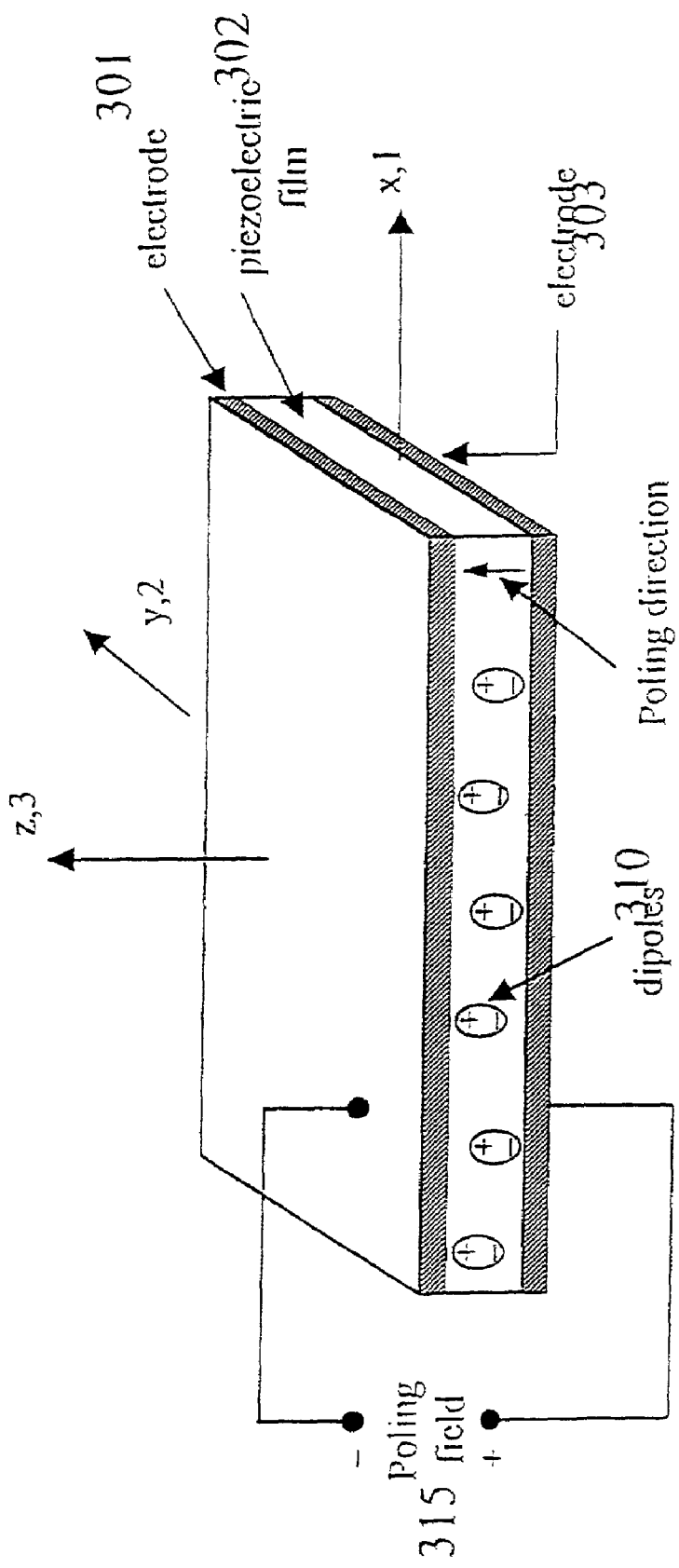
FIG. 3 is a schematic representation of a $PVF_2$ lamina according to the present invention having a piezoelectric film and sandwiching electrodes.

Choosing each lamina to perform a specific function and actuating/sensing each lamina individually or in combination achieves detection and control of the motions of the structure. Designing the surface electrode pattern for each lamina determines the integrated spatial response. For sensing, the electric charge generated due to an external mechanical disturbance will be detected only if the charge is collected by the surface electrode and transmitted to a detecting circuit. Similarly, for actuating, only the parts of the lamina having electrodes will be affected by an externally applied field. Varying the polarization profile within a lamina is achieved by repoling, and the strength of the piezoelectric effect can be varied by doping, creating two-phase piezoelectric composites, or through specific fabrication. The piezoelectric strength of a point in a lamina corresponds to a weighting factor for the sensing/actuating. FIG. 2 is a schematic diagram showing the skew angle ±θ between the structural principal axes x,1 and the material axes x', 1' of each lamina. The skew angle is utilized to achieve torsional mode actuating/detecting in the present invention. FIG. 3 is a schematic representation of a $PVF_2$ lamina 300 according to the present invention having a piezoelectric film 302 and electrodes 301 and 303 sandwiching piezoelectric film 302. The rolling direction x,1 and the poling direction z,3, are shown wherein dipoles 310 will be generated by poling field 315. For example, rolling and poling is required for $PVF_2$ to be piezoelectric with the poling axis defined as the z-axis and rolling (stretching) defined on the x-axis for uniaxially stretched films. $PVF_2$ has symmetry (of a group mm2) where the x and y axes are the normals of the two mirror planes and the z-axis has two-fold symmetry. The piezoelectric strain matrix is $$d_{ip} = \begin{bmatrix} 0 & 0 & 0 & 0 & d_{15} & 0 \\ 0 & 0 & 0 & d_{24} & 0 & 0 \\ d_{31} & d_{32} & d_{33} & 0 & 0 & 0 \end{bmatrix} \quad (1)$$

The constitutive equations of a piezoelectric material is described (using the IEEE compact matrix notation) by $$T_p = c_{pq}^E S_q - e_{kp} E_k \quad (2)$$

$$D_i = e_{iq} S_q + \in_{ik}^S E_k \quad (3)$$

or $$S_p = s_{pq}^E T_q + d_{ip} E_k \quad (4)$$

$$D_i = d_{iq} T_q + \in_{ik}^T E_k \quad (5)$$

where the subscripts i, k=1', 2', 3' and p, q=1', 2', 3', 4', 5', 6'. The subscripts represent the fields which remain constant, $T_p$ and $S_p$ represent stress and strain respectively, $E_k$ is the electric field intensity, $D_i$ is electric displacement, $c_{pq}$ is the elastic stiffness matrix, $s_{pg}=(c_{pg})^{-1}$ is the elastic compliance matrix, $e_{ij}$ is the permittivity matrix, $e_{kp}$ is the piezoelectric stress matrix and $d_{iq}$ is the piezoelectric strain matrix.

From Eqns. (1) and (4), applying an electric field along the z-axis will induce only a normal strain along the material axes. Also, only the normal strain can be detected by measuring electric displacement along the thickness direction (Eqns. (2)–(5)). Referring to FIG. 1, only bending and stretching motions can be actuated or detected by a piezoelectric material with mm2 symmetry alone. Shear strain needs to be generated in order to induce torsion in the beam. In the present invention, the skew angle θ (FIG. 2) is utilized to achieve torsional mode actuating/detecting. This is done by introducing a $d_{36}$ matrix element (Eqn. (1)) through the use of non-zero skew angles so that torsional motion can be induced or detected. From Mohr's circle, it is known that by rotating the plane of observation, the shear strain and normal strain interchanges according to the tensor transformation law. Using the Kirchhoff hypothesis, there is a plane stress state, so the laminae, when disposed in the laminate, is in a plane stress state. Expanding the Kirchhoff hypothesis into the piezoelectric laminates yields the constitutive relationship of each lamina.

Figure 4:
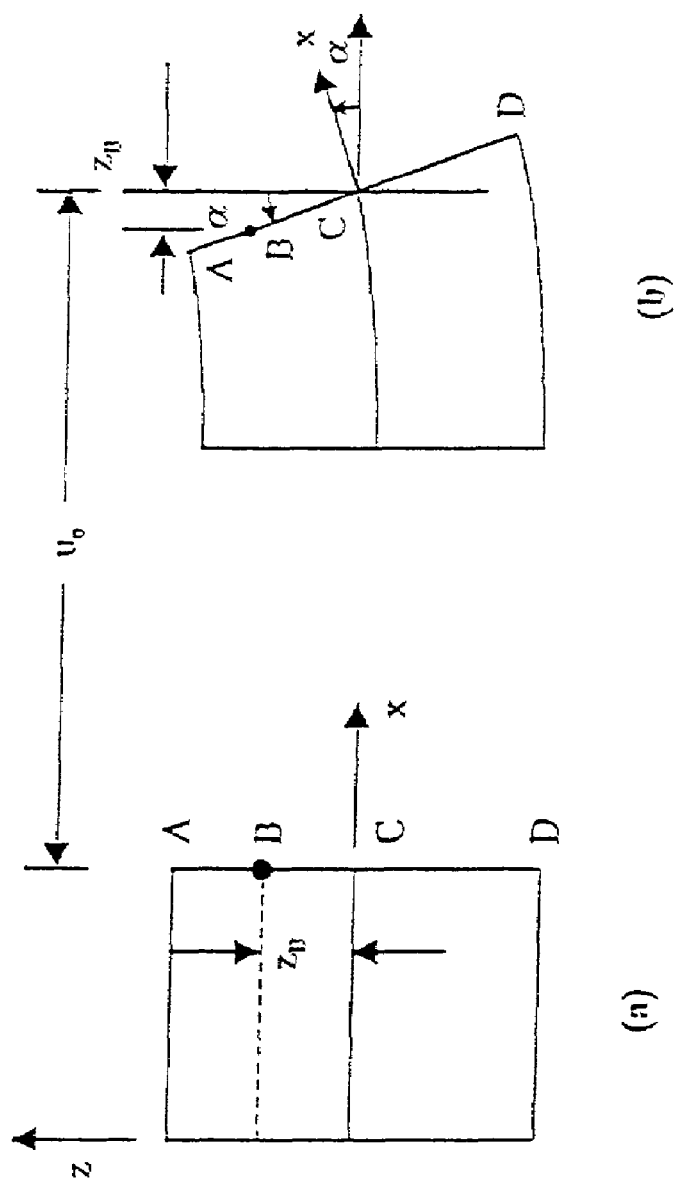
FIG. 4 is a schematic diagram of a section of a laminate in the xz-plane deformed due to a loading according to the present invention.

FIG. 4 is a schematic diagram of a section of a laminate in the xz-plane deformed due to a loading. Point C at the geometric mid-plane undergoes some displacement $u_0$ in the x-direction, the line normal to the geometric mid-plane ABD remains straight and normal to the geometric mid-plane, the displacement of any point on the normal ABD, say of point B, in the x-direction is given by a linear relationship, $u_B = u_0 - z_B \alpha$, where $u_0$ is the mid-plane displacement in the x-direction, $z_B$ is the z-coordinate of point B measured from the geometric mid-plane and $\alpha = \partial w / \partial x$ is the slope of the mid-plane with respect to the z-axis, in other words the curvature. Thus the strain displacement u in the x-direction for an arbitrary point at a distance z from mid-plane is $$u = u_0 - z \frac{\partial w}{\partial x} \quad (6)$$

and similarly for displacement in the y-direction $$v = v_0 - z \frac{\partial w}{\partial y} \quad (7)$$

from linear elasticity, $$S_1 = \frac{\partial u}{\partial x}; S_2 = \frac{\partial v}{\partial y}; S_6 = \frac{\partial u}{\partial y} + \frac{\partial v}{\partial x} \quad (8)$$

therefore, $$\begin{bmatrix} S_1 \\ S_2 \\ S_6 \end{bmatrix} = \begin{bmatrix} S_1^0 \\ S_2^0 \\ S_6^0 \end{bmatrix} + z \begin{bmatrix} k_1 \\ k_2 \\ k_6 \end{bmatrix} = \begin{bmatrix} \partial u_0/\partial x \\ \partial v_0/\partial y \\ \partial u_0/\partial y + \partial v_0/\partial x \end{bmatrix} + z \begin{bmatrix} -\partial^2 w/\partial x^2 \\ -\partial^2 w/\partial y^2 \\ -2\partial^2 w/\partial x \partial y \end{bmatrix} \quad (9)$$

The electrical displacement is given by $$D_3 = e_{31}(S_1^0 + zk_1) + e_{32}(S_2^0 + zk_2) + e_{36}(S_6^0 + zk_6) + \epsilon_{33}^T E_3 \quad (10).$$

Figure 5:
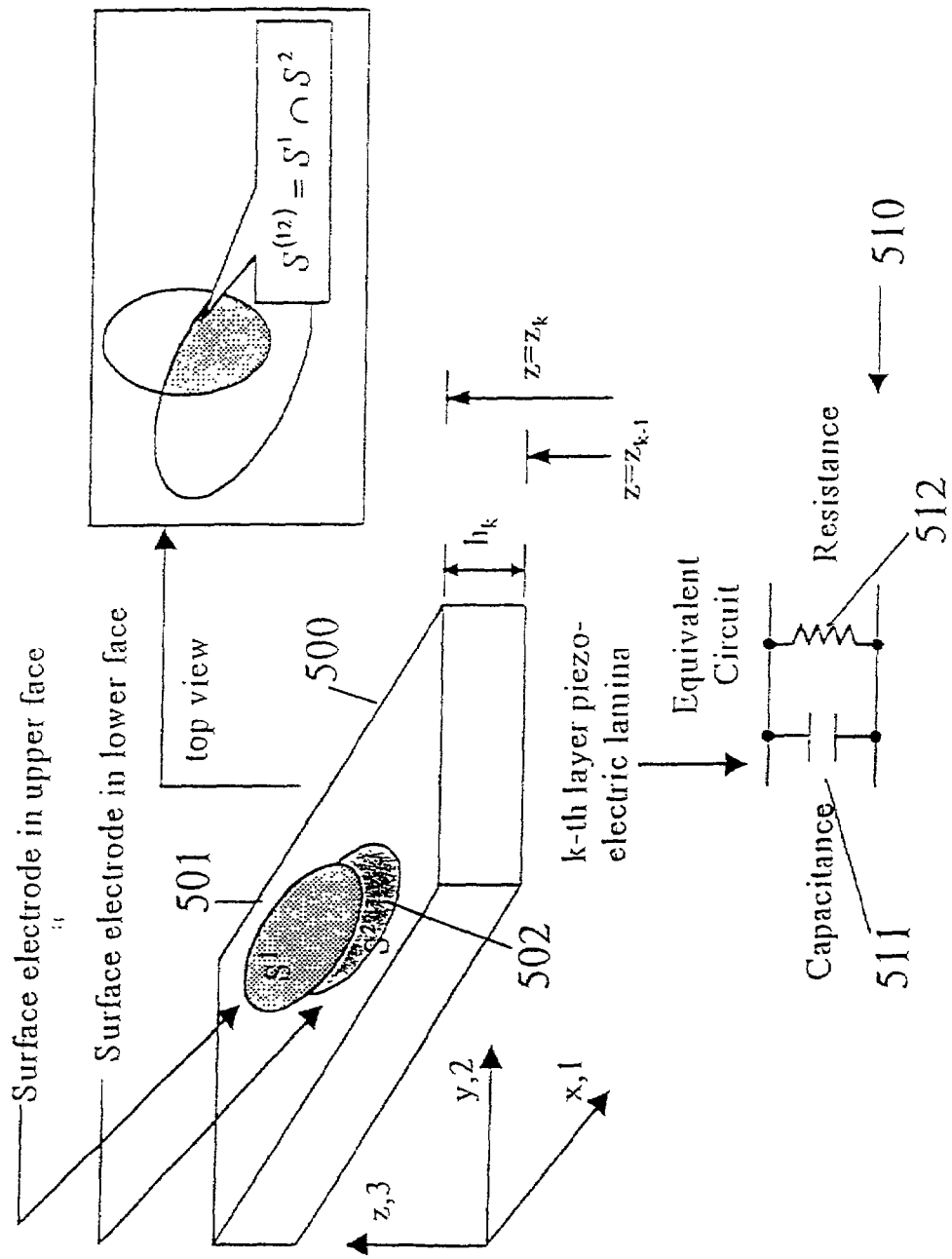
FIG. 5 is a schematic diagram of a piezoelectric lamina having disposed thereon a surface electrode in the upper and lower faces according to the present invention.

Gauss' Law gives the charge enclosed by a surface element S $$q(t) = \int_S D \cdot d\sigma \quad (11)$$

where D is the electric displacement vector and dσ is the differential area normal vector of S. However, the utilization of this equation to describe the charge enclosed in a portion of a piezoelectric lamina, results in a null value because the charge within a dielectric is neutral. Since charge is built up on the surface of a piezoelectric lamina when it is under an external force field, the present invention utilizes an equivalent circuit to relate the closed-circuit charge signal measured for the surface electrode to the force field. FIG. 5 is a schematic diagram of a piezoelectric lamina 500 having disposed thereon a surface electrode in the upper face 501 and a surface electrode in the lower face 502. An equivalent circuit 510 has a capacitor 511 and resistor 512 in parallel. The surface charge built up due to mechanical action is analogous to the charge stored inside capacitor 511 of equivalent circuit 510. The electric displacement is $D = D_3 e_3$, where $e_3$ is a unit vector parallel to the z-axis as shown in FIG. 5. To measure the charge, the electric loop must be closed; that is, the electrode must appear on both sides of lamina 500 (surface electrodes 501 and 502) so that a charge moving in the (z,3)-direction can be measured. More specifically, if surface electrode 501 is on the upper face ($S^1$) of lamina 500 and surface electrode 502 is on the lower face ($S^2$) of lamina 500, the portion of the electrode which is effective during measurement is approximated by $S^{(12)} = S^1 \cap S^2$ where $S^{(12)}$ is the effective surface electrode. Disposing such surface electrodes in a pattern on lamina 500 defines the integration domain where all the points of interest are covered with surface electrodes on both sides of lamina 500. The closed circuit charge measured through the electrodes of the $k^{th}$ layer is $$q_k(t) = \frac{1}{2} \left( \int \int_{S^{(12)}(z=z_k)} D_3 dx dy + \int \int_{S^{(12)}(z=z_{k-1})} D_3 dx dy \right) \quad (12)$$

Substituting Eqns. (9) and (10) into Eqn. (12) and using the fact that $e_{31}$, $e_{32}$, $e_{36}$, $S_1^0$, $S_2^0$, $k_1$, $k_2$, $k_6$, are all independent of z within each lamina, the general sensor charge equation according to the present invention is $$q_k(t) = \quad (13)$$

$$\int \int_{S^{(12)}} \left[ e_{31} \frac{\partial u_0}{\partial x} + e_{32} \frac{\partial v_0}{\partial y} + e_{36} \left( \frac{\partial u_0}{\partial y} + \frac{\partial v_0}{\partial x} \right) + \epsilon_{33}^T E_3 \right] dx dy -$$

$$z_k^0 \int \int_{S^{(12)}} \left[ e_{31} \frac{\partial^2 w}{\partial x^2} + e_{32} \frac{\partial^2 w}{\partial y^2} + 2 e_{36} \frac{\partial^2 w}{\partial x \partial y} \right] dx dy$$

where $Z_k^0 = (z_k + z_{k-1})/2$ and u and v are the displacements in the x and y directions respectively. The first part of Eqn. (13) represents the response of piezoelectric lamina 500 to the in-plane strain, and w in the second part of Eqn. (13) represents the flexural (bending) displacement, which is piezoelectric lamina 500 acting as a sensor's response to an out-of-plane strain. To relate the charge signal to the mechanical deformation of the structure (system dynamics), the electric field $E_3$ is set to zero by short-circuiting the surface electrodes on both sides of piezoelectric lamina 500. Thus, Eqn. (13) is the closed-circuit charge sensor equation relating the in-plane displacements and the curvature of the plate to the output signal. Since i(t)=dq/dt, a general current sensor equation according to the present invention is $$i_k(t) = \iint_{S(12)} \left[ e_{31} \frac{\partial u_0}{\partial x} + e_{32} \frac{\partial v_0}{\partial y} + e_{36} \left( \frac{\partial u_0}{\partial y} + \frac{\partial v_0}{\partial x} \right) \right] dx\,dy - \quad (14)$$

$$z_k^0 \iint_{S(12)} \left[ e_{31} \frac{\partial^3 w}{\partial x^2 \partial t} + e_{32} \frac{\partial^3 w}{\partial y^2 \partial t} + 2 e_{36} \frac{\partial^3 w}{\partial x \partial y \partial t} \right] dx\,dy$$

Figure 6:
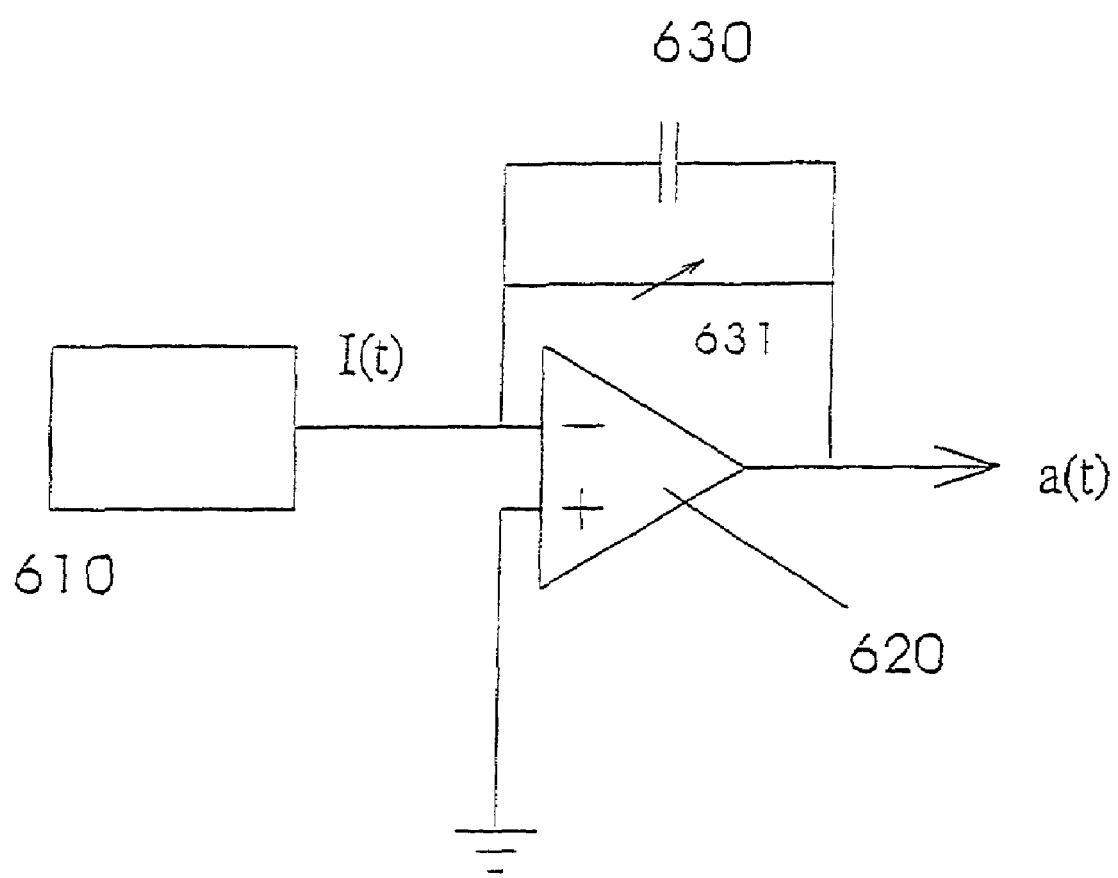
FIG. 6 is a charge amplifier circuit schematic according to a preferred embodiment of the present invention.
Figure 7:
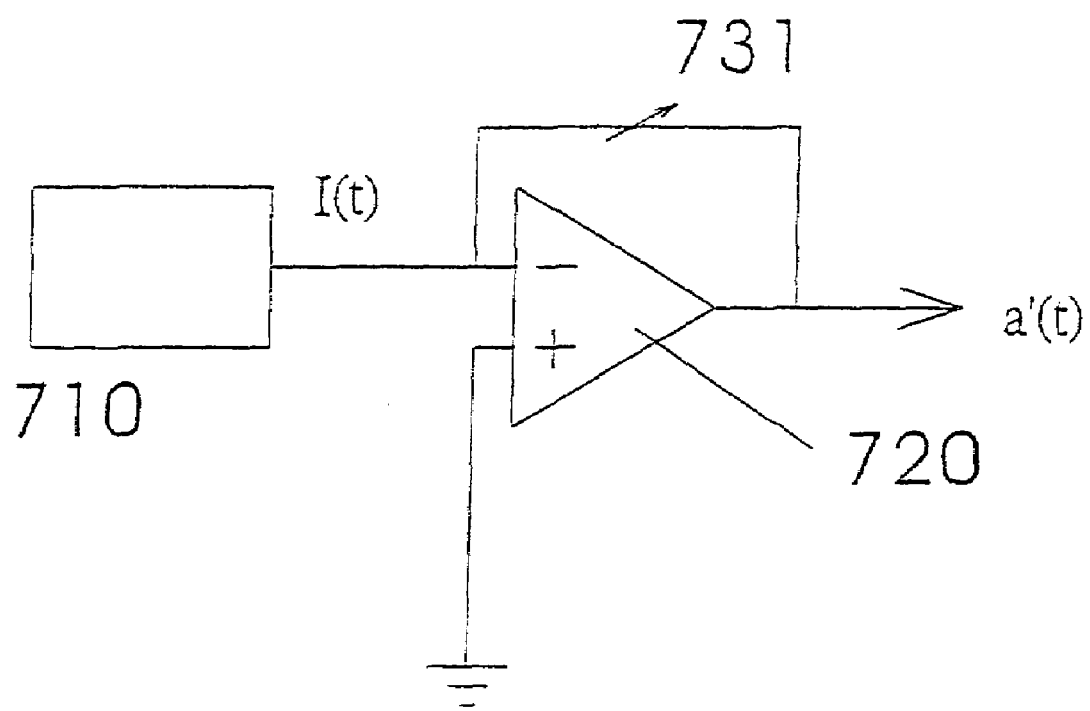
FIG. 7 is a current amplifier circuit schematic according to a preferred embodiment of the present invention.

In operation, to detect strain or displacement, a charge amplifier is utilized. FIG. 6 is a circuit schematic according to a preferred embodiment of the present invention. The circuit comprises a sensor 610, designed utilizing Eqn (13), coupled to the negative input of a charge amplifier 620, which is coupled in series with a capacitor 630 and a variable resistor 631. The positive input of charge amplifier 620 is grounded. Charge amplifier 620 amplifies the acceleration or acceleration rate signal generated by sensor 610. The output of charge amplifier 620 a(t) is the signal to the device to be sensed for motion to initiate a responsive action; for example, a servo-mechanism causing a disk drive read/write head to leave the disk. To detect strain rate or velocity, the present invention utilizes a current amplifier, for example constructed from a regular operational amplifier. FIG. 7 shows a circuit schematic according to an embodiment of the present invention. The circuit comprises a sensor 710, designed according to Eqn (13), coupled to the negative input of a current amplifier 720 which is in parallel with a variable resistor 731. Current amplifier 720 amplifies the acceleration rate signal generated by sensor 710. The output of current amplifier 720 a'(t) is the signal to the device that is motion-sensed to initiate an action: for example a servo-mechanism causing a disk drive read/write head to leave the disk.

Figure 8:
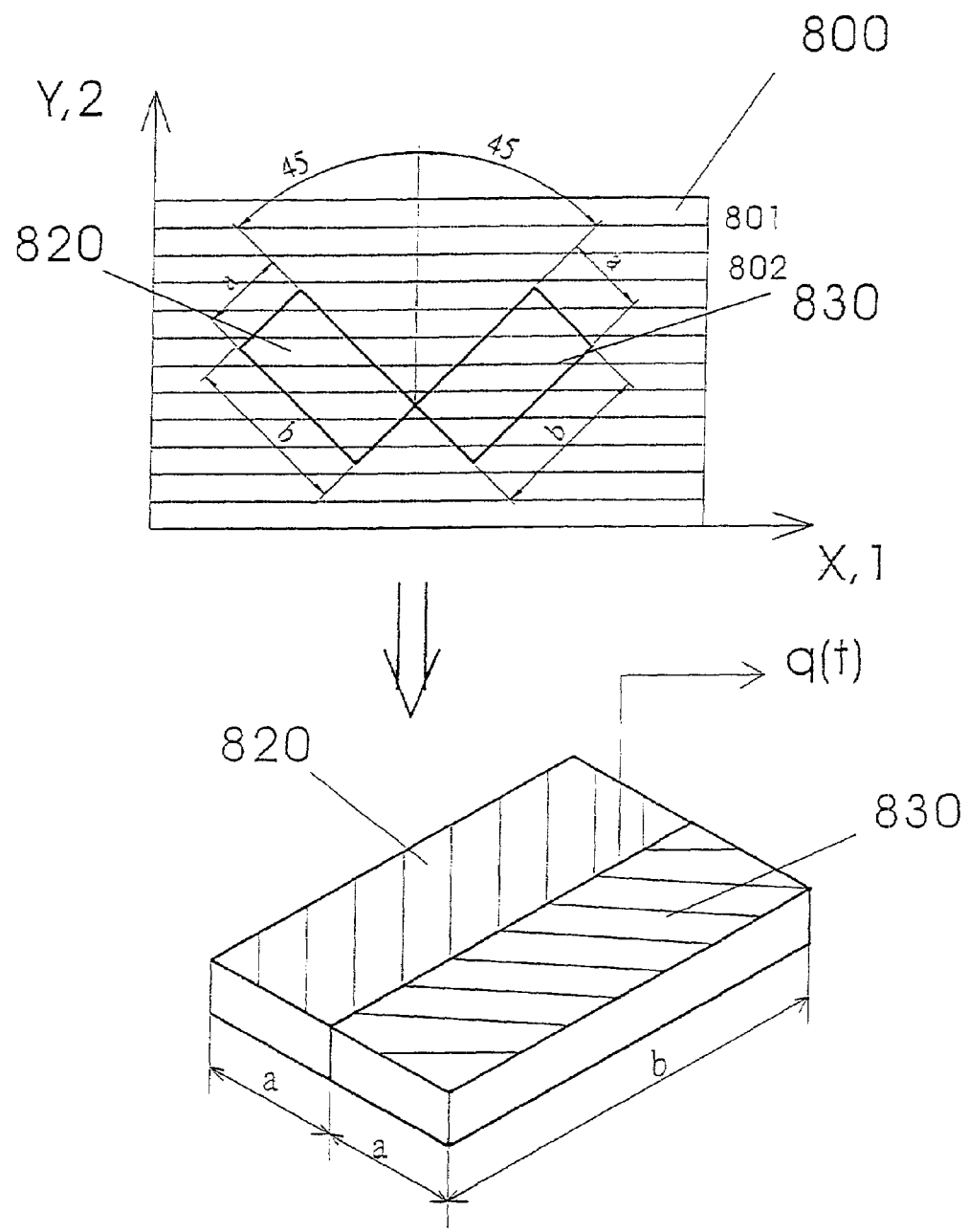
FIG. 8 is a schematic diagram of one embodiment of the present invention showing a piezoelectric lamina for sensing shearing stress motions according to the present invention.

For PVF$_2$, the piezoelectric stress matrix has no $e_{36}$ element (Eqn (1)). In order to have a value, the skew angle θ of the material's principal axis and structural axis must be non-zero to produce a measurable shearing stress. In an embodiment of the present invention, the piezoelectric stress matrix elements $e_{31}$ and $e_{32}$ are equal when θ is 45° and −45° respectively. FIG. 8 is a schematic diagram of one embodiment of the present invention showing a piezoelectric lamina 800 for sensing shearing stress motions. The dotted lines, for example 801 and 802, in piezoelectric lamina 800 indicate the direction of the principal axis of lamina 800. Utilizing surface electrodes polarization directions shown as the 45° angle from the normal to the principal axis direction as shown in panels 820 and 830, the calculation of the surface integral from Eqn. (13) achieves the desired piezoelectric sensor effect, and provides an automatic canceling axial stress effect to eliminate the stress in the principal axis direction 801, which stress affects the motion sensing signal.

For columnar structures undergoing only pure compression or pure tension, the relationship between the sensor deformation and the stress is $$\varepsilon_x = \frac{\partial u}{\partial x} \quad (15)$$

which is applicable for all types of cross sections. For pure torsion of a rod, the relationship for the stress and the torsion is $$\gamma_{xy} = \frac{\partial u}{\partial y} + \frac{\partial v}{\partial x} \quad (16)$$

For pure bending of a beam or plate, the relationship between stress and bending displacement is $$\varepsilon_x = -\frac{\partial^2 w}{\partial x^2} \quad (17)$$

The x-axis in Eqns. (15) and (16) is the beam's axial coordinate, and the x-axis of Eqn. (17) is the principal axis of the lamina or beam. In addition, the shear stress relation in Eqn. (16) can be written as $$\gamma_{xy} = \frac{\partial u}{\partial y} + \frac{\partial v}{\partial x} = r \frac{d\theta}{dx} = \varepsilon_{\theta z} \quad (18)$$

where r is the radius of the rod. In summary, for columns or rods that undergoes no bending displacement, Eqn (13) can be written as:

$$q(t) = \iint_{S(12)} F P_0 \left[ e_{31} \frac{\partial u}{\partial x} + e_{32} \frac{\partial v}{\partial y} + e_{36} \left( \frac{\partial u}{\partial y} + \frac{\partial v}{\partial x} \right) \right] dx\,dy \quad (19)$$

where F is the distributed effective surface electrode function and $P_0=P_0(x,y)$ is the strength of polarization. For PVF$_2$, $e_{36}$ provides shear stress effect only when the piezoelectric lamina principal axis and the principal axis of the structure are at an angle to each other. Thus the present invention utilizes the relative orientation of the piezoelectric material and the structure to directly detect different types of stress and avoid spurious signals. In other words, when the principal axis of a piezoelectric laminate disposed on a columnar beam is collinear with the principal axis of the column, then the torsional stress will not affect the output signal which will only be responsive to the axial deformation.

On the other hand, when a two-dimensional piezoelectric laminate sensor structure only undergoes out-of-plane stress, Eqn. (13) can be simplified as $$q_k(t) = \quad (20)$$

$$-z_k^0 \iint_{S(12)} F(x,y) P_0(x,y) \left[ e_{31}^0 \frac{\partial^2 w}{\partial x^2} + e_{32}^0 \frac{\partial^2 w}{\partial y^2} + 2 e_{36}^0 \frac{\partial^2 w}{\partial x \partial y} \right] dx\,dy$$

where $z_k^0$ is the thickness of the $k^{th}$ lamina.

In the case where the motion of the sensor is only about the x-axis, Eqn. (13) can be simplified as $$q_r(t) = e_{31} \int_0^a \zeta(x) \frac{\partial u}{\partial x} dx \qquad (21)$$

$$q_s(t) = e_{36} \int\!\!\int_{S(12)} \zeta(x,y) \left[\frac{\partial u}{\partial x} + \frac{\partial v}{\partial y}\right] dx dy = e_{36} r^2 \int_{S(12)} \zeta(x) \frac{d\theta}{dx} dx \qquad (22)$$

$$q_p(t) = -z^0 e_{31}^0 \int_0^a \zeta(x) \frac{\partial^2 w}{\partial x^2} dx \qquad (23)$$

$$\zeta(x) = \int_{-b/2}^{b/2} F(x,y) P_n(x,y) dy \qquad (24)$$

Eqn (24) is the effective surface electrode distribution and the q subscripts r, s, and p in Eqns (21) to (23) indicate that those are the sensor equations for columns, rods, and one-dimensional bending laminate plate respectively. F(x,y) is the effective surface electrode distribution function and $P_n$(x,y) is the polarization strength in the n-direction. With respect to the rod and one-dimensional plate, when n equals 1 (i.e., $P_1$(xy)), the polarization strength represented by the piezoelectric strain matrix element $e_{31}$; and when n equals 6, (i.e., $P_6$(x,y)), the polarization strength is represented by the piezoelectric strain matrix element $e_{36}$. The a is the sensor's length on the x- axis and b is the width area on the y-axis. Eqn. (21) assumes a one-dimensional column undergoing pure compression or pure tension stress only in the x-axis direction. Eqn. (22) assumes a one-dimensional rod undergoing pure torsion stress only in respect to the x-axis, and Eqn. (23) assumes a one-dimensional plate undergoing pure bending stress only in respect to the x-axis. Thus, all types of structural motion will only be with respect to the x direction and t (time). Also, u represents the displacement of a column undergoing compression or tension in-plane stress, θ is the angular displacement of the rod undergoing twisting stress, and w is the one-dimensional flexural deflection of the laminate plate. Regardless of what kind of motion of the effective surface electrode ζ(x), it is only effected on the x-axis of the structure, so the same configuration of the effective surface electrode on any one-dimensional structure will have the same effect. Therefore, any structure in accord with the above assumptions can be handled by the sensor structure of the present invention.

According to the present invention the governing equations for a one-dimensional column, rod, and plate and all width damping R are $$E \frac{\partial^2 u(x,t)}{\partial x^2} + R \frac{\partial^3 u(x,t)}{\partial t \partial x^2} - \rho \frac{\partial^2 u(x,t)}{\partial t^2} = 0 \qquad (25)$$

$$G \frac{\partial^2 \theta(x,t)}{\partial x^2} + R \frac{\partial^3 \theta(x,t)}{\partial t \partial x^2} - \rho \frac{\partial^2 \theta(x,t)}{\partial t^2} = 0 \qquad (26)$$

$$EI \frac{\partial^4 w(x,t)}{\partial x^4} - R \frac{\partial^3 w(x,t)}{\partial t \partial x^2} + \rho A \frac{\partial^2 w(x,t)}{\partial t^2} = 0 \qquad (27)$$

where E in Eqn (25) is the Young's modulus, ρ is the density, u is the structure's axial displacement, x is the axial direction. G in Eqn. (26) is the shear modulus, θ is the angle of twist, x is the coordinate along the radial direction of the rod. EI in Eqn (27) is flexural rigidity, A is the structure cross-sectional area, and w is the bending displacement relative to the principal axis x.

If a one-dimensional simple harmonic vibration sensor structure is disposed in the structure to be measured, then the structure's physical vibration is represented by $$V(x,t) = V(x)e^{j\omega t}$$

so for Eqns. (25) to (27), the wavenumber k and the frequency ω relationship are given by the dispersion relations between k-space and ω-space $$k^2 = -\frac{\rho}{E + j\omega R} \omega^2 \qquad (28)$$

$$k^2 = -\frac{\rho}{G + j\omega R} \omega^2 \qquad (9)$$

$$k^2 = j\frac{R}{2EI} \pm \frac{(4EI\rho A - R^2)^{1/2}}{2EI} \omega \qquad (30)$$

so utilizing the characteristic wave propagation polynomial for the sensor structures displacement to enter the propagation state is given respectively by $$u(x,t) = [w_{lp} e^{jk_{lp} x} + w_{rp} e^{-jk_{rp} x}] e^{j\omega t} \qquad (31)$$

$$\theta(x,t) = [w_{lp} e^{jk_{lp} x} + w_{rp} e^{-jk_{rp} x}] e^{j\omega t} \qquad (32)$$

$$w(x,t) = [w_{lp} e^{(jk_R - k_l)x} + w_{rp} e^{-j(jk_R - k_l)x} + W_{le} e^{(k_R - jk_l)x} + w_{re} e^{-(k_R - jk_l)x}] e^{j\omega t} \qquad (33)$$

where $j=(-1)^{1/2}$ recall that u is the axial displacement, θ is the angular displacement, w is the flexural displacement, $w_{lp}$, $w_{rp}$ are the amplitudes of the left and right propagating waves respectively, and $W_{le}$ and $w_{re}$ are the amplitudes of the left and right evanescent waves respectively. From Eqns (31) and (32), it can be seen that the column and rod wave modes transfer are all only propagating waves having identical wave characteristics with only the state of vibration and strength coefficient being different, and $jk_{lp}$ and $-jk_{rp}$ are the imaginary roots of the dispersion relation. In contrast to column and rod type of second order structure systems, the wave modes transfer characteristic of a fourth-order structural system such as a one-dimensional plate is a combination of the effect of the propagating and the evanescent waves, and $k_r$ and $k_l$ are the four root solutions to the dispersion relation. The four numbers will vary according to the boundary conditions and these four waves (right and left propagating and evanescent) are utilized for the design of the present invention.

If Eqns. (31) to (33) are substituted into Eqns. (21) to (23) respectively, and if damping is ignored, the piezoelectric equations are $$q_r(k) = jke_{31} \int_0^a \zeta(x)[w_{lp} e^{jkx} - w_{rp} e^{-jkx}] dx \qquad (34)$$

$$q_s(k) = jke_{36} r^2 \int_0^a \zeta(x)[w_{lp} e^{jkx} - w_{rp} e^{-jkx}] dx \qquad (35)$$

$$q_p(k) = -z_k^0 e_{31} k^2 \int_0^a \zeta(x)[-w_{lp} e^{jkx} - w_{rp} e^{-jkx} + w_{le} e^{kx} + w_{re} e^{-kx}] dx \qquad (36)$$

where r is the radius of the rod. From Eqns. (34) to (36), it can be seen that a spatial wave filter utilizes the two wave modes to transform the effective surface electrode ζ(x) exists. From Eqns (34) and (35), regardless of compression, stretching, or twisting motions, the sensor equations are all left or right propagating wave modes and the effects are the same except that the output values are different. Thus any sensor structure's sensing equation that can be expressed as a second-order general equation is $$q(k) = jk\Lambda \int_0^a \zeta(x)[w_{lp}e^{jkx} - w_{rp}e^{-jkx}]dx \quad (37)$$

where $\Lambda$ is the integrated piezoelectric stress constant for different stress waves. From Eqn. (34), the $\Lambda$ for a column is $e_{31}$, and from Eqn (35) the $\Lambda$ for a rod is $e_{36}r^2$. Eqn. (36) is the linear superposition of the propagating and evanescent waves for bending effect sensor structures. The effective surface electrode $\zeta(x)$ is a function solely of x, and therefore only the axial or principal axis, so a one-dimensional sensor structure, regardless of whether it undergoes pure compression, pure tension, pure torsion, or pure bending motions, can be applied to different motions to provide the same type of wave filter frequency selection effect.

The propagating waves discussed above are for infinite surfaces, but as Eqns. (36) and (37) describe, the structures are of course finite. The present invention achieves practical application through the utilization of a windowing function. In one embodiment, the windowing concept introduced by F. J. Harris (*Proceedings of the IEEE, Vol. 66, No. 1, Janurary 1978, pp* 51–83) is advantageously utilized. The present invention introduces a window function h(x) factor on the surface electrode equations which is non-zero over the structure in question and identically zero outside of the structure. Then utilizing Laplace transforms, the selection of an appropriate window function, the desired effective surface electrode f(x) becomes $$f(x) = h(x)\zeta(x)w_{ml} \quad (38)$$

where $w_{ml}$ is a constant. Generally, each respective relative wavenumber k in Eqns. (36) and (37) is $$L[f(x); s] \int_{-\infty}^{\infty} f(x)e^{-sx}dx \quad (39)$$

where for column or rod type structures, s=jk and −jk; for bending effect sensor structures, such as one dimensional plate s=jk, −jk, k, −k, and f(x) is the windowed effective surface electrode function utilizable for finite extent structures.

A significant objective achieved by the present invention is that the gain and phase function can be separated so that the piezoelectric component's effective surface electrode function f(x) is altered so as to adjust the gain of the frequency response function of the sensor apparatus while not influencing the phase characteristic. This effectively increases the useful bandwidth and stability and furthermore in the system feedback loop, directly provides compensation capability, thereby enhancing total system performance.

In accordance with a preferred embodiment of the present invention, a free fall sensor disposed on a disk drive provides a low pass wave filter effect which can eliminate high frequency noise thereby obviating conventional electronic wave filter gain adjustment-induced phase lag. This is achieved by utilizing waves as a basis to measure the acceleration and rate of acceleration of a falling body.

From Eqns. (36) and (37), regardless of what the sensor structure is, utilizing similar independently designed gain and phase functions in the motion sensing apparatus according to the present invention, provides identical spatial frequency selection. In a preferred embodiment of the present invention, a miniature one-dimensional suspended plate designed with a low-pass or a band-pass filter characteristic frequency selector is disposed on the casing of a disk drive for detecting a free fall signal. By signaling appropriate damage-avoidance action, the present invention increases the applicability of the disk drive (e.g., for military or other hostile environment use), decreases the possibility of damage, and lengthens its useful life.

Because the gain and phase function can be independently designed in the sensors of the present invention, utilizing Laplace transforms, the spatial filter effect is achieved only for the targeted origin of the Laplace transform pair. From Eqn. (36), the independently designed gain and phase function of the motion sensor allows specific designing for a wave mode region. The dispersion relation Eqn. (30) is the transformation between the wave number domain and the frequency domain. Since the present invention can use the surface electrode to influence the wave number domain, the dispersion relation can be used to control the sensor structure system frequency response function. From Eqn. (33), the present invention assumes that the different designs are in simple harmonic resonance; that is, the term exp(−jωt) is intentionally ignored. If the sensing point is not at the source of the motion of the sensor structure, then there will be a discrepancy with the simple harmonic motion assumption. Because the motion source is entered at a stationary point of the suspended plate, the fixed point of the sensor structure is chosen as the origin of the design, thereby avoiding any discrepancies caused by the position of the motion source and the targeted origin being different. Under this design, the present invention's frequency response will only reflect the characteristic response of the sensor structure plus the additional no-phase-delay gain tailoring introduced by this invention.

Figure 9:
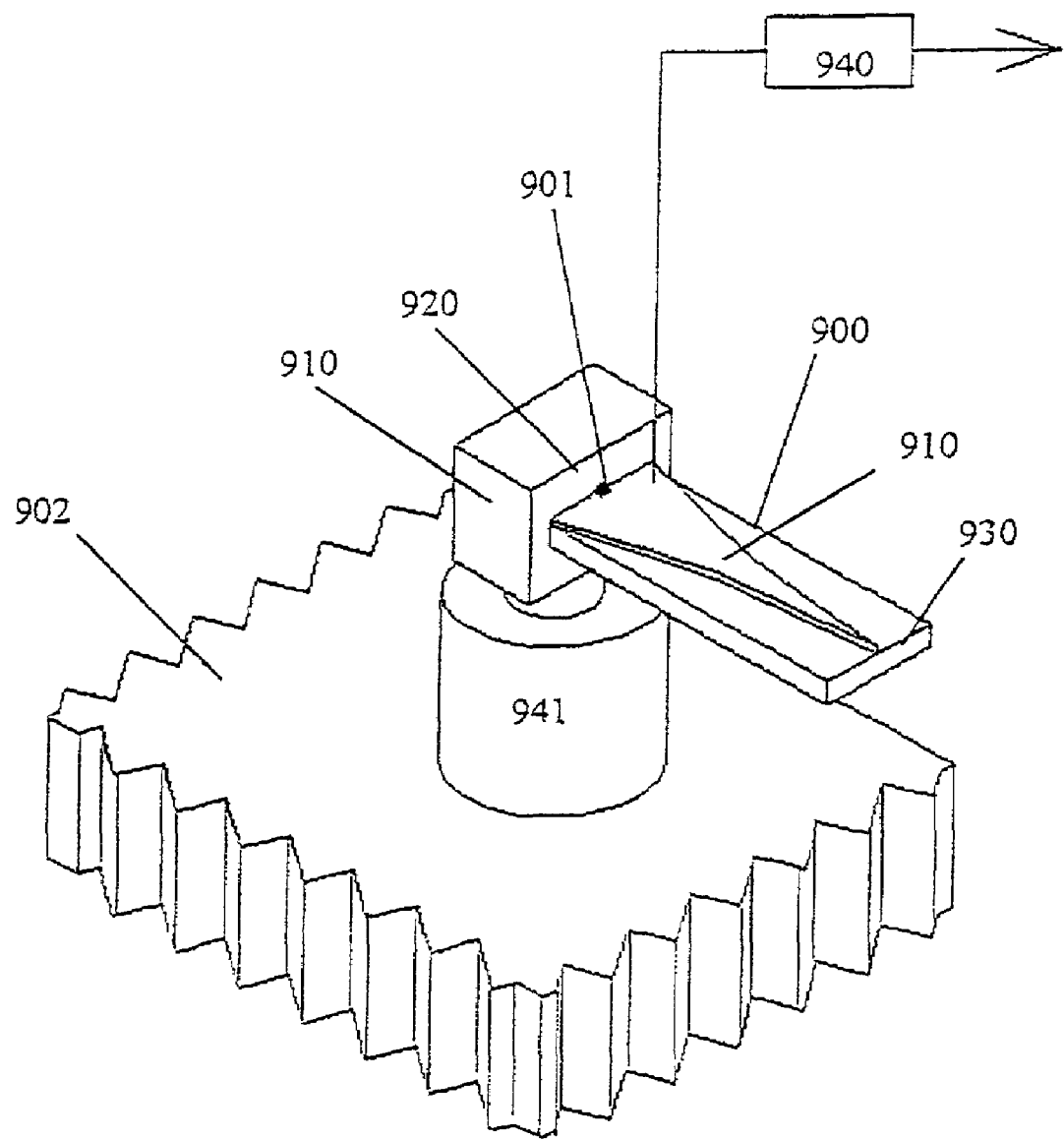
FIG. 9 is a schematic diagram of a suspended laminate beam in an embodiment of the present invention.

FIG. 9 is a schematic diagram of an embodiment of the present invention showing a suspended laminate plate 900 having a targeted origin point 901 through which motions pass from the structure 902 to plate 900. Beam 900 has a fixed end 920 joined to a base head 910 which is in turn attached to a base 941. Beam 900 also has a free end 930. A schematic of a circuit interface 940 is coupled to the one-dimensional plate 900 for transmitting acceleration and acceleration rate signals to, for example, a disk drive system (not shown). According to the present invention the wave transfer via the piezoelectric sensor elements on plate 900 produces the spatial wave filters so that when the waves in plate 900 propagate back and forth, they continually "see" the piezoelectric laminate and surface electrodes composing the piezoelectric sensing elements. A weighting function is then utilized to reflect the effect on the wave transfer of the different widths of the sensor materials along the y-axis entering the sensor structures, thereby producing the spatial wave filter of the present invention.

When the waves reach the boundary of the sensing structure, there will be a phase change or energy dissipation due to different boundary conditions, and the free end and the fixed end of plate 900 are the most likely boundary condition determiners. The present invention utilizes the concept of "method of image" (cf. K. G. Graff, *Wave Motion in Elastic Solids*) to address the limited space wave correspondence relation with an unlimited space wave. Utilizing this approach, the wave transmission at the free end of beam 900 will experience no phase change, therefore except for when the direction of propagation is directly opposite, the wave will be continuous. However, wave transmission at the fixed end of plate 900 will experience a 180° phase change. Therefore, the present invention's independent gain and phase function designs successfully solves the phase delay problem.

Figure 10:
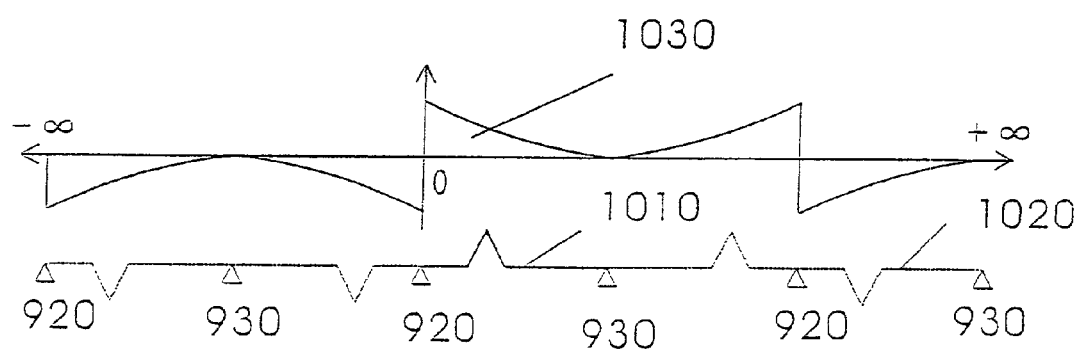
FIG. 10 is a schematic diagram of the sensor structure with the fixed end and free end represented as the axis crossing and maxima/minima points respectively according to the present invention.

FIG. 10 is a schematic diagram of the method of image utilized in the present invention for mapping a wave propagation in the finite structure to the corresponding infinite structure. The dotted lines triangle points are the fixed end 920 (FIG. 9) and free end 930 (FIG. 9) Thick solid line 1010 represents a wave propagating through the structure. Dotted line 1020 represents a finite piezoelectric sensor structure wave transformed into an infinite wave utilizing the method of image expansion. Curved line 1030 represents the gain and phase function of a bi-directional wave propagating in the structure according to the independently designed gain and phase function of the present invention where the expansion in infinite space being an odd function can be clearly seen. From the design viewpoint, the leftward and rightward propagating waves on the two sides of the same shaped evanescent and propagating wave generate the same signal. Similarly, the two waves each leaving the targeted origin also generate the same signal. The independently designed gain and phase function applied to the sensing structure's frequency response function generates gain yet does not change the phase is because (from the design viewpoint) its past, present and future information are all present. Therefore, gain is achieved but phase is not changed by the present invention. If effective surface electrodes situated at the sides of the structure's center point are symmetric, then eqn. (36) is $$q(k) = -z_k^0 e_{31} k^2 \qquad (40)$$
$$\left[ (-w_{lp} + w_{rp}) \int_{-a}^{a} f(x) e^{-jkx} dx + (w_{le} + w_{re}) \int_{-a}^{a} f(x) e^{-kx} dx \right]$$

Thus, the present invention is a system providing a low pass, a band-pass filter or a high-pass filter that generates no phase change through the proper selection of a surface electrode function f(x). In other words, the spatial frequency selector according to the present invention varies gain yet does not change the phase and frequency relationship.

From Eqn. (40), the propagation wave and the evanescent wave are in the form of natural logarithms so when the surface electrode has a natural log for its basis function, it can effectively control the spatial frequency selection characteristic curve. In other words, knowing the surface electrode's basis function gives the spatial filter's characteristic. Similarly, generating the desired piezoelectric sensor conditions from the methods of the present invention allows optimum design and manufacture of an appropriate sensor for a specific use.

Figure 11:
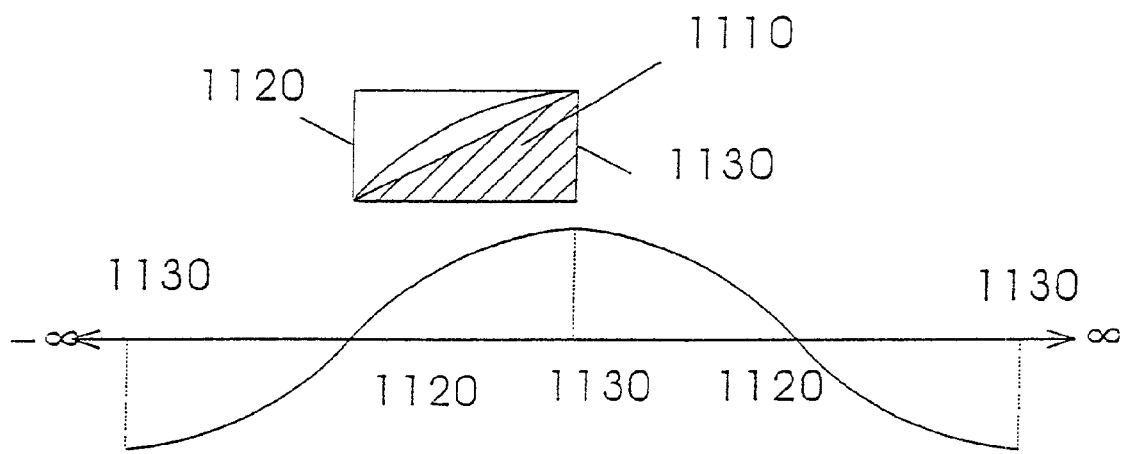
FIG. 11 is a schematic diagram of the method of image utilized in the present invention for a wave propagation from the finite structure to the infinite structure.

Setting the effective surface electrode as $e^{-\alpha|x|}$, from the Laplace transform pair, the odd function spatial frequency selection function directly enters a low-pass filter into the sensing structure's transfer function, the transfer function being $s/(\alpha^2-S^2)$, where $\alpha$ is the selected corner frequency of the low-pass filter and s is $-jk$ or $-k$. However, because its value at the boundary is not zero, it is not possible to extend to an infinite space. Therefore, again utilizing the window function, setting the boundary wave's weighting function to zero, the transfer function can be extended to the boundaryless region. Utilizing the method of image technique, and taking into consideration the suspended plate's boundary characteristics, a sine function directly extends to the boundaryless area. FIG. 11 is a schematic diagram of the sensor structure 110 with the fixed end 1120 and free end 1130 represented as the axis crossing and maxima/minima points respectively. From the Laplace pairs, 0 to transfer function is $\alpha/(\alpha^2+s^2)$, and 0 to transfer function is $-\alpha/(\alpha^2+s^2)$, thus the sine function will not induce any frequency selection for the effective surface electrode. The present invention utilizes the null characteristic of sine function to effect an effective surface electrode function as $$f(x) = e^{-\alpha|x|} - c \sin[\beta(x)] \qquad (41)$$

where makes the sine function a ¼ factor of the period in the finite space, c makes the surface electrode function boundary value zero weight. Substituting Eqn. (41) into Eqn. (40), the two surface electrode combined sine function will not generate any effect on the spatial filter's gain. Eqn (40) for a low frequency characteristic selection of the present invention sensor equation is represented by $$q(k) = -z_k^0 e_{31} k^2 \left[ (-w_{lp} + w_{rp}) \frac{s}{\alpha^2 - s^2} + (w_{le} + w_{re}) \frac{s}{\alpha^2 - s^2} \right] \qquad (42)$$

where s is the propagating wave and the evanescent wave's transforms parameter $-jk$ and $-k$ respectively. From Eqn. (42), the present invention's low-pass filter generates no phase delay (cf. FIG. 12(b)). Furthermore, the sensing structure itself will have a decreased self-resonance effect and increased useful frequency range and stability. Since the propagating and evanescent waves transform parameters are different, the sensors transfer function are zero, and Eqn. (42) becomes $$q(k) = -z_k^0 e_{31} k^2 \left[ (-w_{lp} + w_{rp}) \frac{j}{\alpha^2 - s^2} + (w_{le} + w_{re}) \frac{1}{\alpha^2 - s^2} \right] \qquad (43)$$

Before the frequency value reaches the corner frequency value ($\alpha=-40$ dB/decade) extreme, there will be a 20 dB/decade zero point having no phase delay. Thus the present invention becomes a $-20$ dB/decade low pass frequency selector.

The present invention's independent gain and phase function design providing a low pass frequency selector effect has the same capability as a second-order system. From Eqn (37) for a column structure, only the propagating wave effect need be considered, and for a rod structure as the sensing structure, measuring the physical motion produced by compression or twisting of a free fall body can be represented in a sensor equation according to the present invention as $$q(k) = jk\Lambda(w_{lp} - w_{rp}) \frac{jk}{\alpha^2 + k^2} \qquad (44)$$

Figure 12:
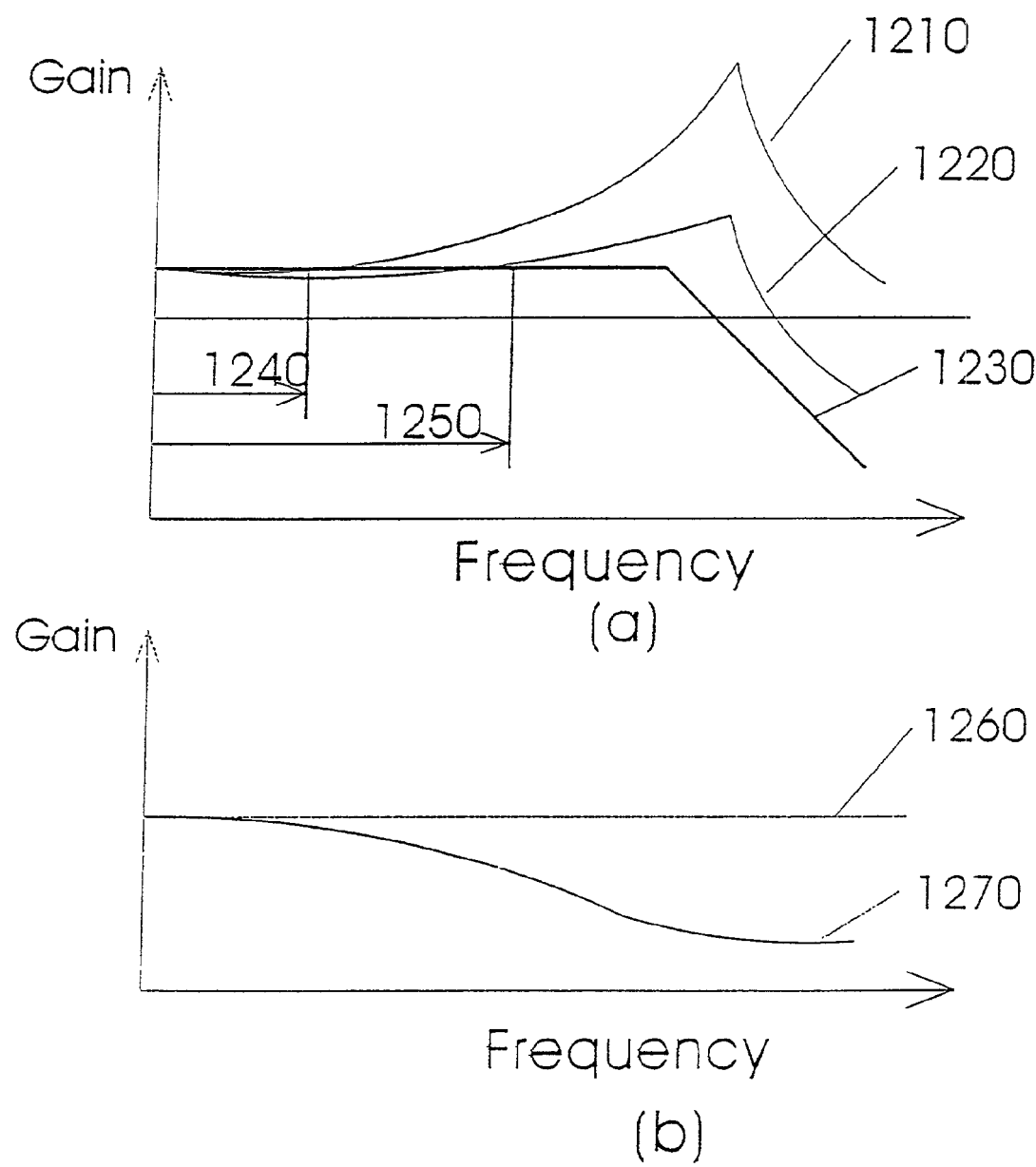
FIG. 12(a) is a gain versus frequency graph showing frequency response curves resulting from the output of a spatial wave filter implemented in a sensor structure according to the present invention.
FIG. 12(b) is a phase versus frequency graph showing the effect of the present invention on the system phase change.
Figure 13:
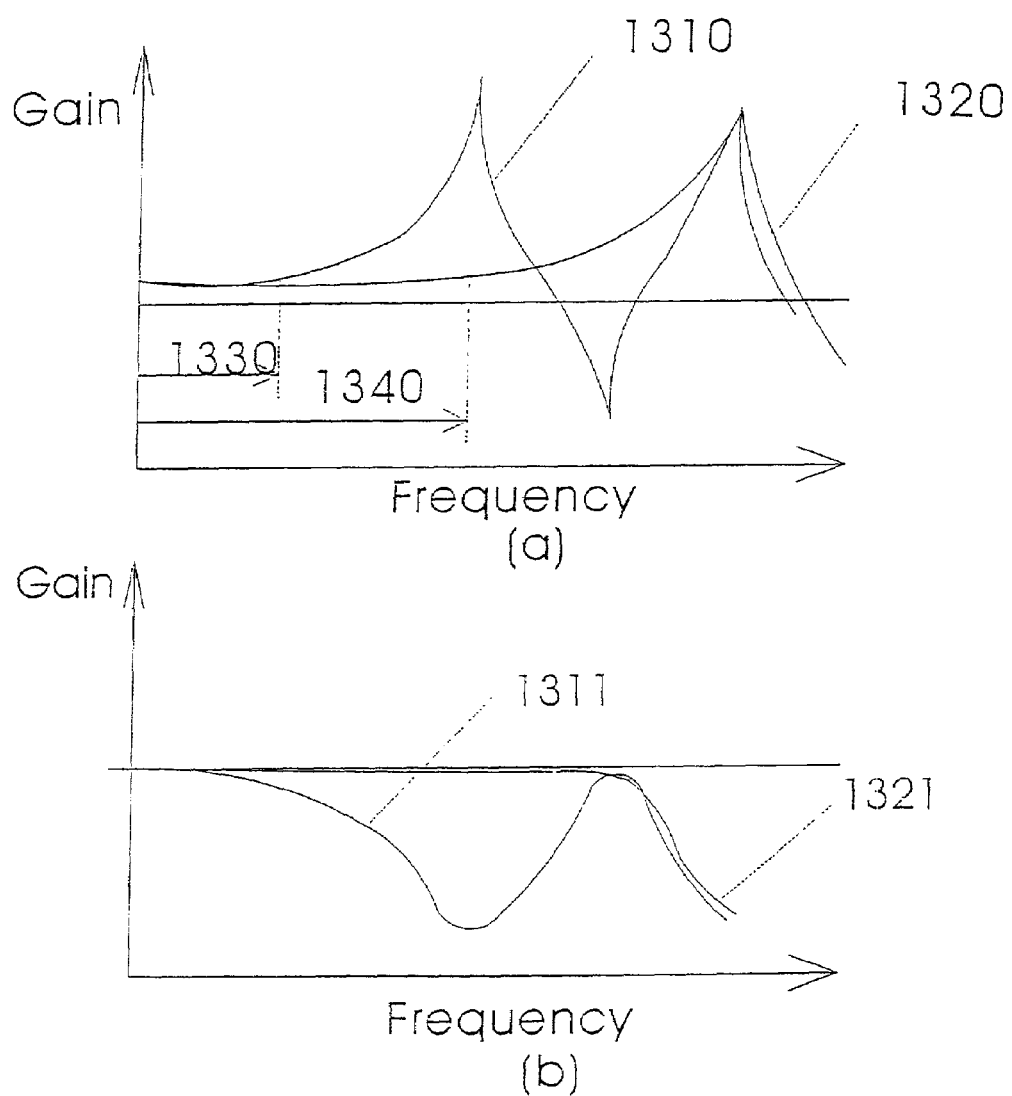
FIG. 13(a) is a gain versus frequency graph showing the effect of the utilization of modal discrete point sensors according to the present invention.
FIG. 13(b) is a phase versus frequency graph showing a constant phase relation for a significantly larger frequency range according to the present invention.

FIG. 12(a) is a gain versus frequency graph showing frequency response curves resulting from the output of a spatial wave filter implemented in a sensor structure according to the present invention. It can be seen that frequency response curve 1220 advantageously utilizing a spatial wave filter according to the present invention can utilize frequency band 1250 whereas a sensing system not utilizing a spatial wave filter can only utilize frequency band 1240 which is considerably narrower. FIG. 12(b) is a phase versus frequency graph showing the effect of the present invention on the system phase change. Frequency response curves 1260 and 1270 assume the gain frequency response curve (idealized) of FIG. 12(a). Curve 1260 is frequency response curve utilizing the present invention, showing no phase change over the frequency domain, whereas curve 1270 is the phase change resulting from conventional systems. FIG. 13(a) is a gain versus frequency graph showing the effect of the utilization of modal discrete point sensors according to the present invention. It is clear from FIG. 13(a) that frequency response curve 1320, which is a result of the implementation of a modal discrete point sensor system can utilize the bandwidth 1340 which is considerably wider than the conventional sensing systems 1310 which covers only bandwidth 1330. FIG. 13(b) is a phase versus frequency graph showing the phase shift for curve 1311 where it can be seen that curve 1321 provides constant phase relation for a significantly larger frequency range. It should be noted that in utilizing the spatial wave filter and modal approach, the system gain response function is adjustable, and further it will not follow the conventional causal method of adjusting phase in prior art electronic wave filters. The present invention achieves adjustment of the frequency response characteristic of system gain while not causing a phase shift in the sensing system. Gain and phase function are each utilized to design the motion detection apparatus of the present invention.

Thus it is clear that the present invention not only increases the effective spatial wave bandwidth of the sensing/actuation, but also results in no system phase change In the feedback circuit, the present invention provides frequency selection and compensating in the frequency response effect. Thus the present invention is applicable to many different kinds of structures.

The following descriptions of applications are examples of the many and myriad applications of the present invention. Any structure which is amenable to a conformable sensor structure (meaning almost any structure since conformability of the sensor makes it universally applicable). Examples range from accelerometers to earthquake seismometers. For free fall sensing, the present invention can give an instantaneous signal before impact with the ground to warn the system being monitored, enabling damage prevention measures (for example, in disk drives, ordering the read/write head of a disk drive to move away from the disc). Although the descriptions given below will be primarily directed to notebook computer hard disk drives, it is understood by those in the art that any apparatus wherein motion detection is required is a suitable application of the present invention.

Figure 14:
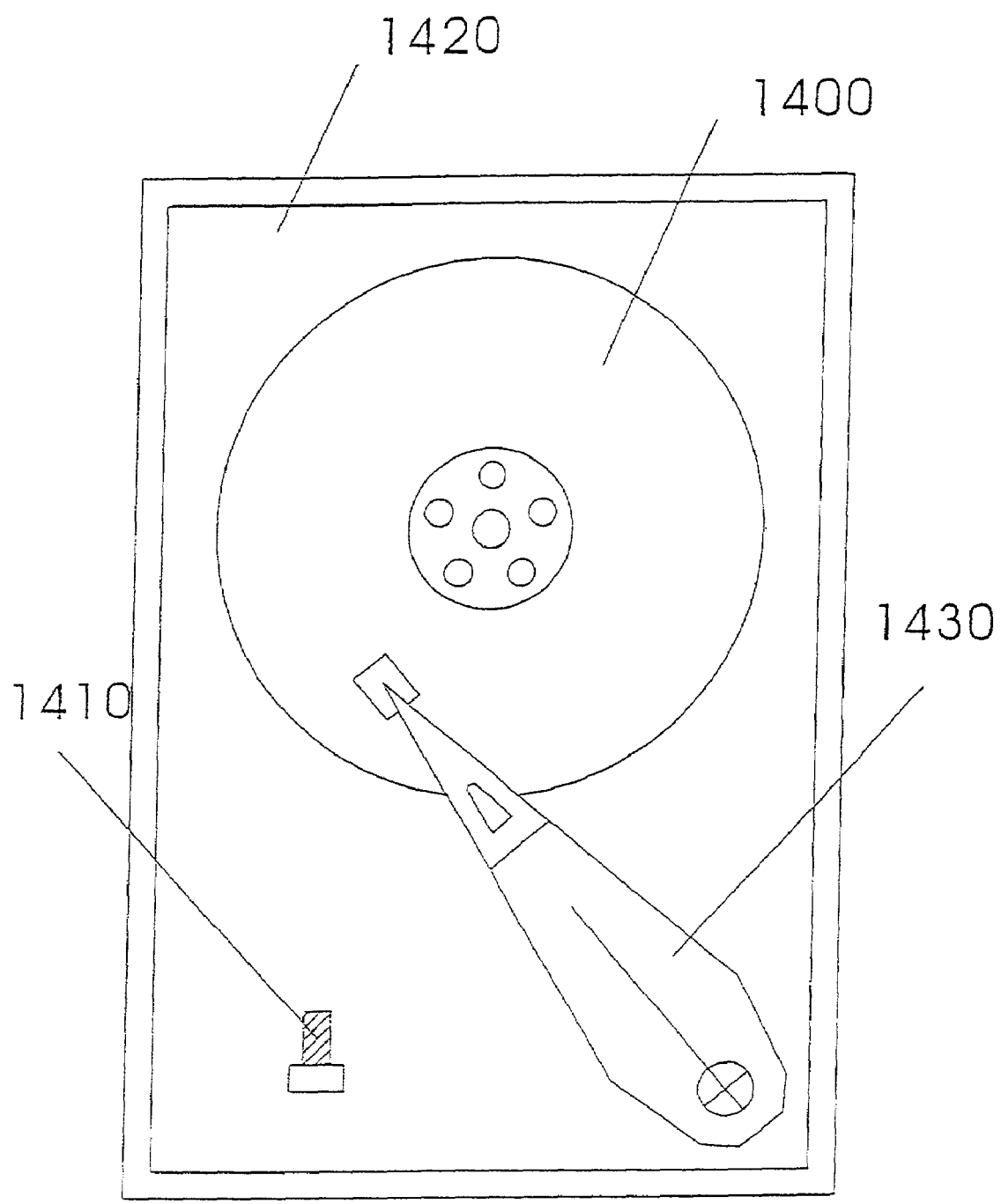
FIG. 14 is a schematic drawing of an exemplary disk drive having a casing and deposed thereon a motion detector according to the present invention.

FIG. 14 is a schematic drawing of an exemplary disk drive 1400 having a casing 1420 and deposed thereon a motion detector 1410 according to the present invention to detect motions caused by impacts and unpredicted motions which may cause improper read/write operations. The present invention, upon detection of certain motions, will cause read head 1430 to temporarily leave disk 1440 to avoid damage or data corruption.

Figure 15:
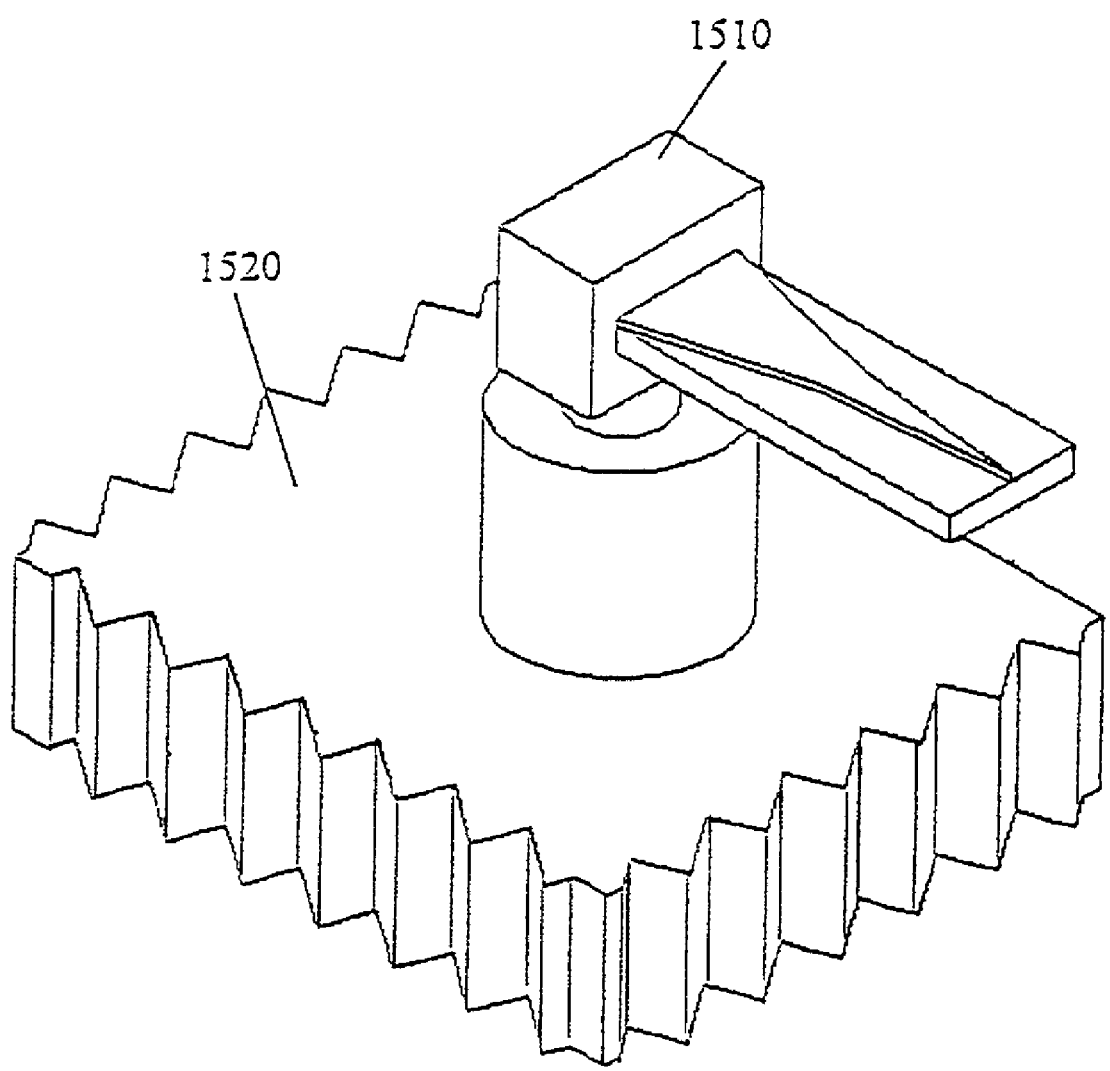
FIG. 15 is a schematic drawing of a turning effect sensor according to the present invention disposed on a disk drive casing.
Figure 16:
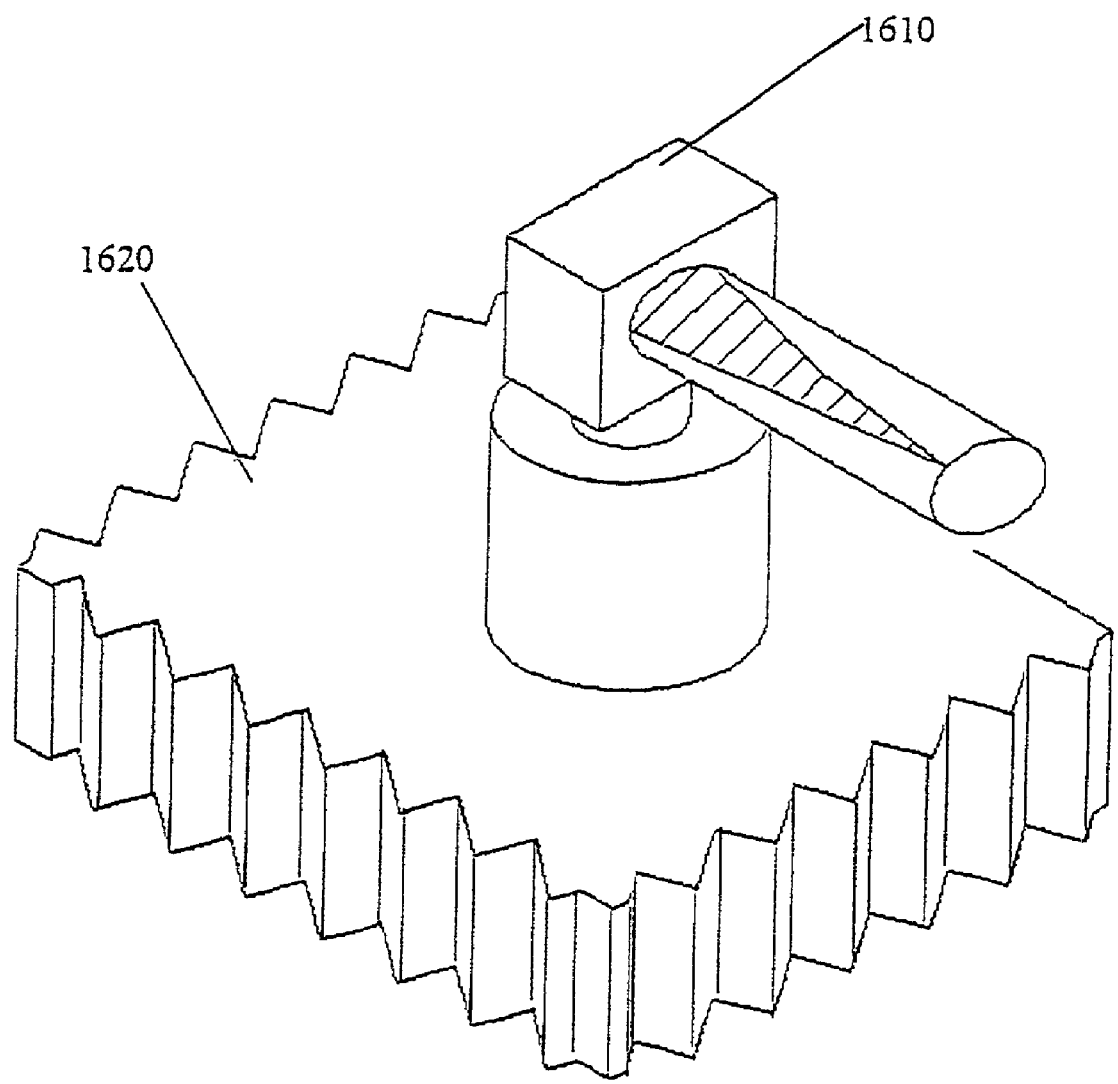
FIG. 16 is a schematic drawing of a twist effect sensor according to the present invention disposed on a disk drive casing.
Figure 17:
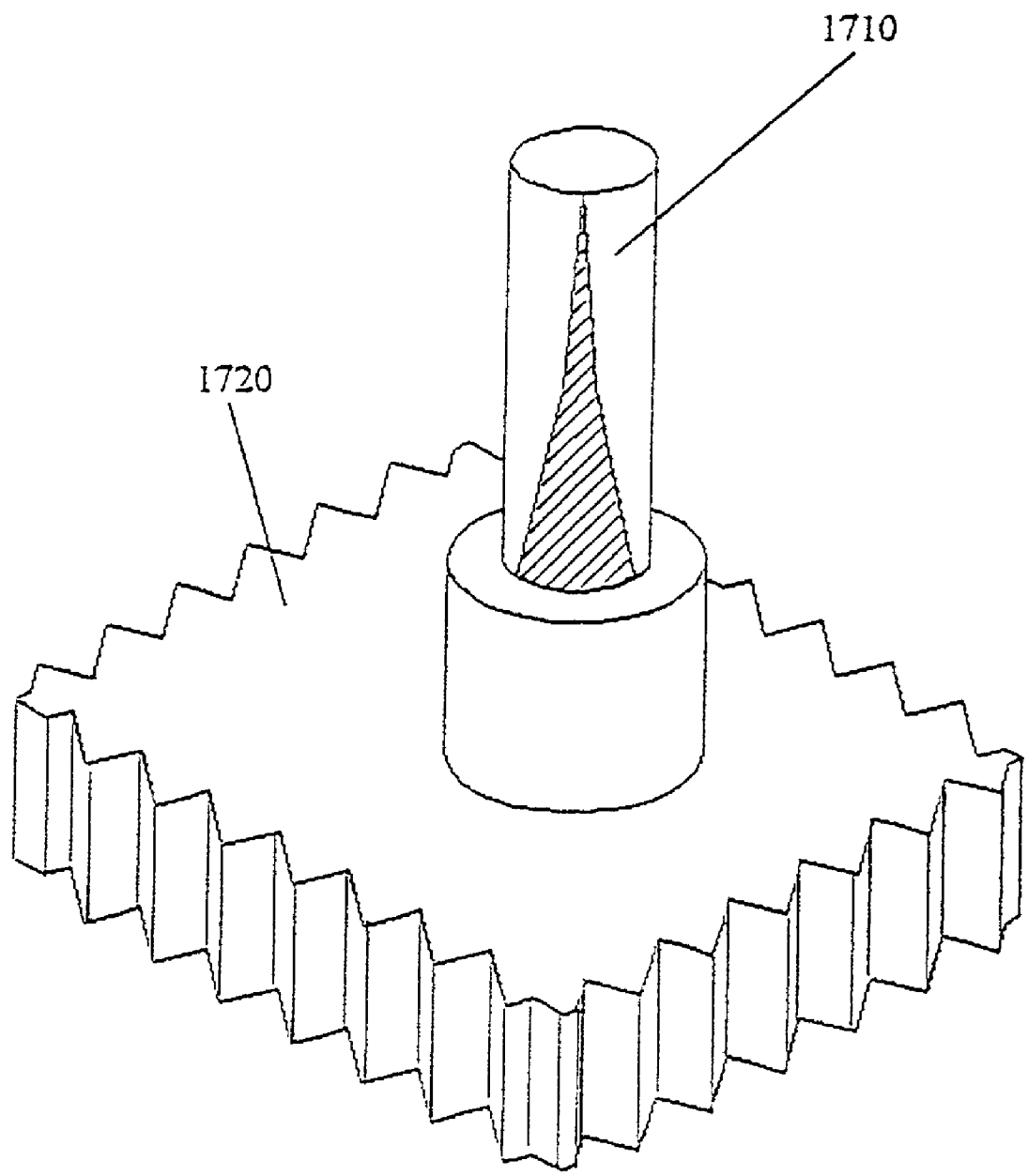
FIG. 17 is a schematic drawing of a compressing/stretching effect sensor according to the present invention disposed on a disk drive casing.

FIG. 15 is a schematic drawing of a turning effect sensor 1510 for detecting turning motions according to the present invention by disk drive casing 1520 upon which it is disposed. FIG. 16 is a schematic drawing of a twist effect sensor 1610 for detecting twisting motions of disk drive casing 1620 according to the present invention. FIG. 17 is a schematic drawing of a compressing/stretching effect sensor 1710, according to the present invention, for detecting compression or tension of the disk drive. Sensor 1710 is disposed upon disk drive casing 1720.

An embodiment of the present invention described above is utilized in computer hard disk drives. In another embodiment, the present invention is utilized in precision instruments and machinery, including robots. Various embodiments are utilized in systems requiring high precision sensing of different types of motion. Embodiments of the present invention have been utilized in feedback control systems, fail-safe (or uninterruptable continuous) systems, and manufacturing operations.

A high percentage of notebook computer malfunction is due to impact of the computer with hard surfaces, including falling contact with the ground. Impacts take only microseconds while the scan operation of the read/write head on hard disks takes at least several miniseconds. Thus it is practically impossible to direct the read head to leave the disk in time to prevent corruption of data and/or (in the worst case) damage to the read/write head solely by detecting the impact. But the present invention detects the initiation of the gravitational acceleration of the falling motion of the computer. Thus there is no need to wait for the impact force to sense that something bad has happened. Conventional accelerometers are not capable of detecting such small accelerations (they are typically used in automobile air bags where they detect the extreme acceleration of the impact). The present invention advantageously utilizes the fact that a body will undergo an instant of external force at the instant of entering the free fall state. It is precisely this extremely short force that is detected by the present invention. The state of free fall for a dropped notebook computer typically lasts for approximately 0.45 seconds (or in subseconds range). This time is generally long enough to enable the action of moving the read/write head. In the case where the falling height is so small that there is insufficient time to move the read/write head, it may be presumed that the impact will be correspondingly small so that little or no damage or corruption of data occurs. An impact can be described by a Taylor expansion as $$f(t \to 0^+) = \quad (45)$$
$$f(0) + \frac{df(t=0^+)}{dt}t + \frac{d^2 f(t=0^+)}{dt^2}\frac{t^2}{2!} + \frac{d^3 f(t=0^+)}{dt^3}\frac{t^3}{3!} + \ldots$$

Typically, the initial force of a sudden wave is zero (f(0)=0) and the first order term is a rapidly rising curve, so when the impact wave reaches the sensor of the present invention, the acceleration will be detected first. In other words, before the acceleration has actually begun, the present invention has already sensed the motion.

In most cases, collisions do not occur with great frequency, so if a detector detected every possible collision, it would unnecessarily continually alert the read/write head to leave the disk, causing serious performance degradation. Most collisions generate impulsive accelerations and acceleration rates which are described by a delta function whereas free-fall bodies generate a step function acceleration and delta function acceleration rate. The present invention utilizes the difference between these two functions to differentiate whether the body is falling or merely has been pushed or lightly hit by another object and thereby determine whether or not to cause the read/write head to leave the disk.

In summary, a miniature sensor according to the present invention, when disposed on a body to be detected for motion (such as a disk drive), utilizing piezoelectric sensing elements on a sensing structure provides low pass filtering, elimination of external and structure-generated high-frequency noise. The present invention, when coupled to an interface electric circuit (such as in a notebook computer) senses the low frequency signal of a falling motion to provide a warning for immediate damage avoidance: for example, the sensor circuit will order the servo-mechanism of a disk drive to cause the read/write head to leave the disk). This will enhance performance, avoid damage, and thereby increase the useful life of the device.

While the above is a full description of the specific embodiments, various modifications, alternative constructions and equivalents may be used. For example, the present invention is suitable for compact disc players, precision instruments of all kinds, and robotic devices. Therefore, the above description and illustrations should not be taken as limiting the scope of the present invention which is defined by the appended claims.

What is claimed is:

1. A method for sensing wave motion utilizing piezoelectric laminates having a distributed surface electrode modal sensor array disposed thereon, comprising the steps of:
   generating said distributed surface electrode modal sensor array utilizing a normal made expansion;
   determining the boundary conditions responsive to the shape of the piezoelectric laminates;
   spatially filtering the wave motion to generate a characteristic polynomial wave transmission spatial bandpass filter; and
   adjusting the frequency response of the spatial bandpass filter to increase the bandwidth; thereby providing a method for detection of different types of wave motions.

2. A method for sensing wave motion utilizing piezoelectric laminates having a distributed surface electrode modal sensor array disposed thereon, comprising the steps of:
   collecting the charge generated by deformations in the piezoelectric laminates utilizing the distributed surface electrode modal sensor array to generate a characteristic wave;
   spatial modal filtering said characteristic wave to generate characteristic electrical signals;
   parallel processing said characteristic electrical signals to determine the motion sensed.

3. The method of claim 2 wherein said spatial modal filtering step utilizes a wave mode formulation and a dispersion relation, thereby generating transfer functions for said distributed surface electrode modal sensor array having an amplitude response substantially similar to low-pass filter.

4. A sensing method of sensing the vibration of a targeted structure, comprising the steps of:
   (a) sensing the vibration as a wave motion utilizing a least a layer of piezoelectric lamina sensor having a plurality of electrodes disposed thereon;
   (b) utilizing a spatial wave filter coupled to the said piezoelectric lamina and electrodes, responsive to the back and forth propagation of the wave transfer on said piezoelectric laminate sensor, and weighting said spatial wave filter responsive to the width of said piezoelectric laminate sensor, said filtered wave transfer upon reaching the boundary of said piezoelectric laminate sensor undergoing a boundary condition phase change;
   (c) transmitting the wave motion-generated electrical signal by the said piezoelectric lamina to a interface circuit, wherein said electric circuit transmits an activation signal responsive to an active device.

5. The sensing method of claim 4 further comprising the step of utilizing the "method of image" to convert a limited space wave to an unlimited space wave.

6. The sensing method of claim 5 wherein said method of image generate a wave retaining the same phase at the free end and a 180° phase change at the fixed end, thereby avoiding phase delay.

* * * * *